United States Patent
Yang et al.

(10) Patent No.: US 6,707,496 B1
(45) Date of Patent: Mar. 16, 2004

(54) CMOS SENSOR HAVING ANALOG DELAY LINE FOR IMAGE PROCESSING

(75) Inventors: Hongli Yang, Sunnyvale, CA (US); Xinping He, San Jose, CA (US); Datong Chen, Fremont, CA (US)

(73) Assignee: OmniVision Technologies, Inc., Sunnyvale, CA (US)

( * ) Notice: Subject to any disclaimer, the term of this patent is extended or adjusted under 35 U.S.C. 154(b) by 0 days.

(21) Appl. No.: 09/397,634

(22) Filed: Sep. 15, 1999

(51) Int. Cl.$^7$ ............................. H04N 3/14; H04N 5/335

(52) U.S. Cl. ....................................... 348/303; 348/304

(58) Field of Search ................................ 348/320, 321, 348/302, 308, 312, 323, 303, 304

(56) References Cited

U.S. PATENT DOCUMENTS

| | | | |
|---|---|---|---|
| 4,513,312 A | | 4/1985 | Takemura |
| 4,542,409 A | | 9/1985 | Ochi |
| 4,652,911 A | | 3/1987 | Teranishi et al. |
| 4,658,287 A | * | 4/1987 | Chen .......................... 348/305 |
| 4,686,373 A | | 8/1987 | Tew et al. |
| 4,719,508 A | * | 1/1988 | Sasaki et al. .................. 348/71 |
| 4,768,098 A | * | 8/1988 | Vogelsong .................. 348/306 |
| 4,939,573 A | | 7/1990 | Teranishi et al. |
| 5,043,821 A | * | 8/1991 | Suga et al. .................. 348/320 |
| 5,280,358 A | * | 1/1994 | Yushiya et al. ............. 348/247 |
| 5,282,025 A | | 1/1994 | Sato |
| 5,464,984 A | | 11/1995 | Cox et al. |
| 5,901,257 A | | 5/1999 | Chen et al. |
| 6,289,139 B1 | * | 9/2001 | Chen et al. .................. 382/312 |

FOREIGN PATENT DOCUMENTS

| | | |
|---|---|---|
| EP | 0 757 497 | 2/1997 |
| JP | 08 182005 | 7/1996 |

OTHER PUBLICATIONS

Cormier, D., "Solid–State Optical Sensors Improve Their Image," *ESD: The Electronic System Design Magazine*, 36–42 (1989).

Denyer, P.B. et al., "Intelligent CMOS Imaging," *SPIE*, 2415:285–291 (1995).

Fossum, E.R., "Active Pixel Sensors: Are CCD's Dinosaurs?", *SPIE*, 1900:2–14 (1993).

(List continued on next page.)

*Primary Examiner*—Wendy R. Garber
*Assistant Examiner*—Matthew L Rosendale
(74) *Attorney, Agent, or Firm*—Perkins Coie LLP

(57) ABSTRACT

The present invention is directed to an analog delay line for a color CMOS image sensor which is compatible with MOS fabrication technology. The invention allows for the simultaneous reading of pixel signals from two rows of pixels so that combinations of signals from pixels in different rows may be obtained. The delay line includes a set of storage capacitors on which the pixel signals are stored, and a means for writing the signals from the pixels onto the capacitors in sequence. The stored analog pixel signals may then be read out from the delay line at the appropriate time so that they may be combined with pixel signals from adjacent pixels in different rows. In one embodiment, two delay lines are used, so that pixel signals from a current row can be written into one delay line, while the pixel signals from a previous row are being read out from the other delay line. In another embodiment, a single delay line is used in combination with a single pixel delay circuit. When the single pixel delay circuit is used, the pixel signals from a previous row are read out from the delay line and temporarily stored in the single pixel delay circuit, one at a time, shortly after which the pixel signals from the next row are written into the delay line. The pixel signals from the single pixel delay circuit are then read out at the same time that the pixel signals from the next row are being read in, so that signals from adjacent pixels in adjacent rows are available to the processing circuitry at the same time.

18 Claims, 12 Drawing Sheets

OTHER PUBLICATIONS

Hodgson, R.M. et al., "Charge transfer devices and their application," *New Zealand Engineering*, 34:246–249 (1979).

Imaide, T. et al., "Single–Chip Color Cameras with Reduced Aliasing," *Journal of Imaging Technology*, 12, No. 5:258–260 (1986).

Mendis, S.K. et al., "Progress in CMOS Active Pixel Image Sensors," *SPIE*, 2172:19–29 (1994).

Nixon, R.H. et al., "128X128 CMOS Photodiode–type Active Pixel Sensor With On–chip Timing, Control and Signal Chain Electronics," *SPIE*, 2415:117–123 (1995).

Onga, M. et al., "New Signal–Processing LSIs for the 8mm Camcorder," *IEEE Transactions on Consumer Electronics*, 36, No. 3:494–501 (1990).

Parulski, K.A., "Color Filters and Processing Alternatives for One–Chip Cameras," *IEEE Transactions on Electron Devices*, ED–32 No. 8:1381–1389 (1985).

Tsuruta, S. et al., "Color Pixel Arrangement Evaluation for LC–TV," *Conference Record of the 1985 International Display Research Conference*, 85 CH2239:24–26 (1985).

Watanabe, T. et al., "A CCD Color Signal Separation IC for Single–Chip Color Images," *IEEE Journal of Solid–State Circuits*, SC–19, No. 1:49–54 (1984).

* cited by examiner

CMOS SENSOR HAVING ANALOG DELAY LINE FOR IMAGE PROCESSING

FIELD OF THE INVENTION

The present invention relates to metal oxide semiconductor (MOS) image sensors and, more particularly, an analog delay line for a MOS image sensor.

BACKGROUND OF THE INVENTION

Integrated circuit technology has revolutionized various fields including computers, control systems, telecommunications, and imaging. In the field of imaging, the charge coupled device (CCD) sensor has made possible the manufacture of relatively low-cost and small hand-held video cameras. Nevertheless, the solid-state CCD integrated circuits needed for imaging are relatively difficult to manufacture, and therefore are expensive. In addition, because of the differing processes involved in the manufacture of CCD integrated circuits relative to MOS integrated circuits, the signal processing portion of the imaging sensor has typically been located on a separate integrated chip. Thus, a CCD imaging device includes at least two integrated circuits: one for the CCD sensor and one for the signal processing logic.

Some of the further drawbacks of CCD technology are discussed in "Active Pixel Sensors—Are CCD's Dinosaurs?" by E. R. Fossum, Proceedings of the SPIE—The International Society for Optical Engineering, Vol. 1900, 1993, pp. 2–14. As stated therein, "[a]lthough CCDs have become a technology of choice for present-day implementation of imaging and spectroscopic instruments due to their high-sensitivity, high quantum efficiency, and large format, it is well-known that they are a particularly difficult technology to master. The need for near-perfect charge transfer efficiency makes CCDs (1) radiation 'soft,' (2) difficult to reproducibly manufacture in large array sizes, (3) incompatible with the on-chip electronics integration requirements of miniature instruments, (4) difficult to extend the spectral responsivity range through the use of alternative materials, and (5) limited in their readout rate."

An alternative low-cost technology to CCD integrated circuits is the metal oxide semiconductor (MOS), integrated circuit. Not only are imaging devices using MOS technology less expensive to manufacture relative to CCD imaging devices, for certain applications MOS devices are superior in performance. For example, the pixel elements in a MOS device can be made smaller and therefore provide a higher resolution than CCD image sensors.

Examples of MOS imaging devices are detailed in "A ¼ Inch Format 250 K Pixel Amplified MOS Image Sensor Using CMOS Process" by Kawashima et al., IEDM 93-575 (1993), and "A Low Noise Line-Amplified MOS Imaging Devices" by Ozaki et al., IEEE Transactions on Electron Devices, Vol. 38, No. 5, May 1991. In addition, U.S. Pat. No. 5,345,266 to Denyer, titled "Matrix Array Image Sensor Chip," describes a MOS image sensor. The devices disclosed in these publications provide a general design approach to MOS imaging devices. In addition, MOS approaches to color imaging devices are described in "Color Filters and Processing Alternatives for One-Chip Cameras," by Parulski, IEEE Transactions on Electron Devices, Vol. ED-32, No. 8, August 1985, and "Single-Chip Color Cameras With Reduced Aliasing" by Imaide et al., Journal of Imaging Technology, Vol. 12, No. 5, October 1986, pp. 258–260.

In the movement from CCD- to MOS-based implementations that can be fabricated on a single MOS chip, certain concepts from the CCD technology have not transferred smoothly. One example is related to the external CCD-delay line that is still used in many image processors to obtain the necessary signals from two rows of pixels simultaneously. The need to process two rows of pixels simultaneously is related to the processing of signals from complementary color filter patterns, as is described in more detail below.

In most solid-state color image sensors, a complementary color filter pattern is used. Arrays of pixels may be made to detect color by being covered with a regular pattern of color filter patches, known as a color filter pattern. The filter patches can be fabricated directly on the sensor or on a transparent substrate which is later cemented to the chip. Color filter patterns may include colors such as red (R), green (G), blue (B), yellow (Ye), cyan (Cy) and magenta (Mg). The pixels beneath the color filter pattern emit signals when they are exposed to the type of light indicated by the color filter patch. Thus, a red signal could be obtained from a pixel beneath a red filter patch, a blue signal could come from a pixel beneath a blue filter patch, and so on.

However, some image sensors do not obtain the standard red, green and blue signals from red, green and blue filtered pixels. Instead, they use combinations of other colors to obtain the standard ones. For example, red (R) can be formed according to the equation R=(W+Ye)−(G+Cy), where the color filter pixel signals are W=white, Ye=yellow, G=green, and Cy=cyan. In cases such as this, the four pixel signals being processed are obtained from a 2×2 block of one of each type of pixel sensor, rather than a 1×4 row of pixel sensors which would tend to distort the color image. The 2×2 block presents a problem for standard pixel scanning methods because standard methods scan each row, one at a time. In contrast, the 2×2 block of pixels comes from sections of two separate rows. Thus, the system cannot process the data as it scans each row. It must wait until the next row is also scanned to obtain the remaining information that it needs, and it must somehow save the data from the previous row until it does so.

Just as the color signals in such cases can be a combination of the signals from a 2×2 pixel block, the chrominance signal, which correlates to the color of the image, is also sometimes obtained from a combination of signals from pixels in two separate rows. In fact, this is the case for the chrominance signal in many systems, even those in which R, G and B filters are used to obtain the color signals directly. Therefore, it is required in such systems to somehow have the data from two separate rows available at the same time so that the required combinations can be processed.

A standard method for making the data from two separate rows available at the same time is to use a delay line. The delay line holds the data from one row until the next row can be scanned to provide the needed information. One simple type of delay line is a digital delay line. The digital delay line stores digital values representative of the pixel signals from a given row. Digital delay lines are commonly used in MOS imaging devices. However, in order to use a digital delay line, the pixel signals must necessarily be first converted to digital values before they are stored in the digital delay line. One of the problems with converting the pixel signals to digital values at this early stage, is that the analog-to-digital processing requires a significant amount of power. This is an undesirable characteristic in certain implementations of imaging devices.

An alternative to a digital delay line that has been used in most prior art CCD devices is an analog CCD delay line. FIG. 1 illustrates a general CCD delay line of the prior art.

As illustrated in FIG. 1, signals from a sensor array are received via a signal line V0 by a CCD delay line 10. The CCD delay line 10 delays the pixel signals as it takes time for the signals to cascade down the cells of the CCD delay line. The CCD delay line is controlled so that after a first row of pixels has been read into the CCD delay line, the signal from the first pixel of the first row is read out from the CCD delay line on the signal line V1 at the same time that the pixel signal from the first pixel of the second row is being received on the signal line V0. In this manner, the signal processing circuitry 12 receives the signals from adjacent pixels in two different rows at the same time. In this manner, a 2×2 pixel block may be obtained for signal processing, as described above.

In the movement from CCD- to MOS-based implementations, methods of implementing the circuitry have been sought that can easily be fabricated on a single MOS chip. The approach of using an external CCD delay line device in the color image sensors, which was carried over from the old CCD technology, has inherently required the use of CCD components that are external to the circuit and that are sometimes required to be on a separate chip, in addition to increasing the relative complexity of the implementation. It is a general principle that power consumption and cost would decrease if the number of chips and complex components necessary to accomplish the task were decreased. The present invention is directed toward an improved analog delay line that can be fabricated using MOS technology, and which can therefor be integrated on a single-chip with the MOS sensor array.

SUMMARY OF THE INVENTION

The present invention is directed to an analog delay line for a MOS image sensor which allows the simultaneous reading of pixel signals from two adjacent rows of pixels so that combinations of signals from pixels in adjacent rows may be obtained. The delay line includes a set of storage capacitors, a first set of switches for selectively placing signals from a row of the pixel array on the first set of storage capacitors, and a second set of switches for selectively reading out the signals from the storage capacitors. In one embodiment of the invention, two delay lines are utilized, such that the signals from one row of the pixel array can be being stored in one of the delay lines, while the signals from the previous row of pixels that were previously stored in the other delay line can be being read out. In another embodiment of the invention, a single delay line is used, in combination with a single pixel delay circuit. In the second embodiment, the signals that were previously stored in the delay line from the previous row are read out one at a time into the single pixel delay circuit, just ahead of when the new signals from the pixels of the next row are being read into the delay line. In this manner, the pixel signals from the single pixel delay circuit can be being output at the same time that the pixel signals from the next row are both being stored in the delay line, and are available for signal processing. Thus, signals from adjacent pixels in adjacent rows can be being read out simultaneously, as is the goal of the invention.

The single pixel delay circuit includes a set of two storage capacitors, a set of two input switches for selectively placing pixel signals on the two storage capacitors, and a set of two output switches for selectively reading out the pixel signals that were previously stored on the two storage capacitors. Various amplifiers and buffers are used in combination with the delay line and single pixel delay circuit structures, so as to effectively transfer the pixel signal charges. The capacitors, MOS switches, buffers, and amplifiers of the reading structure are easily fabricated as part of a MOS image sensor on a single chip.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
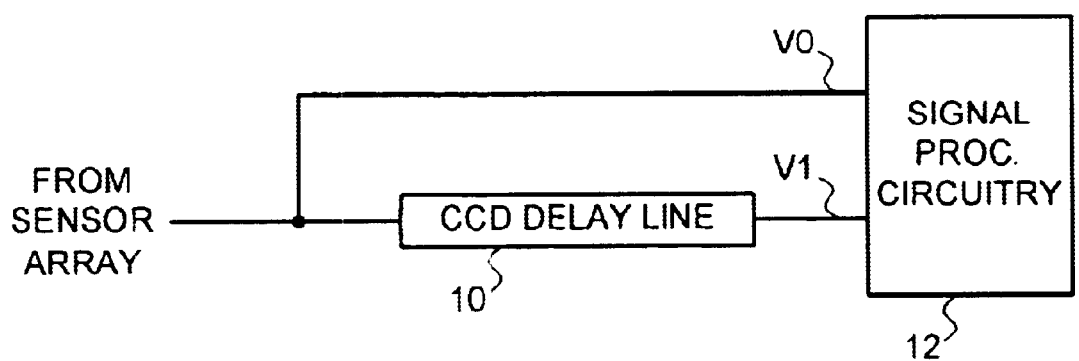
FIG. 1 is a block diagram of a prior art CCD delay line.
Figure 2:
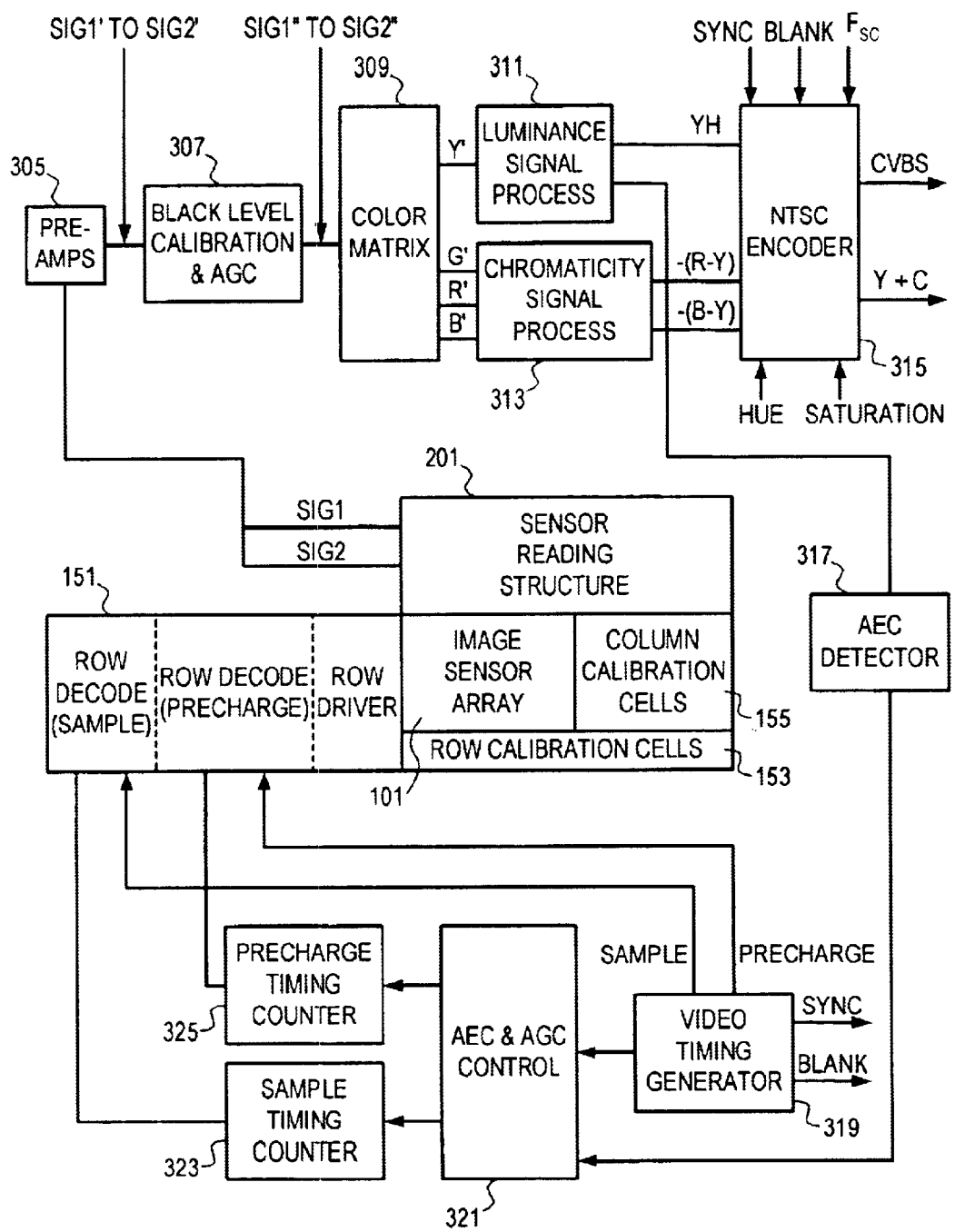
FIG. 2 is a block diagram of a single-chip CMOS imaging sensor with an analog delay line formed in accordance with the present invention.

With reference to FIG. 2, a block diagram of a single-chip CMOS imaging sensor includes an image sensor array 101. The retrieval of information from the image sensor array is done by the peripheral circuitry of FIG. 2 and the output is done in accordance with the well-known NTSC scheme. This scheme allows the output signals from the circuit to be transmitted and displayed by conventional means.

The signals from the sensor array 101 are processed by a sensor reading structure 201, which is formed in accordance with the present invention. As will be later explained, this novel reading structure allows the reading of two line signals from two separate rows of pixels simultaneously, through the use of an analog non-CCD-type delay line device. The sensor reading structure 201 outputs line signals SIG1 and SIG2, which are amplified by signal amplifiers 305. In one actual embodiment, the signal amplifiers 305 are formed in accordance with U.S. Pat. No. 5,724,095 entitled "IMPROVED CHARGE AMPLIFIER FOR MOS IMAGING ARRAY AND METHOD OF MAKING SAME," to Shyu et al., and U.S. Pat. No. 5,751,189 entitled "IMPROVED CHARGE AMPLIFIER FOR MOS IMAGING ARRAY AND METHOD OF MAKING SAME," to Shyu et al., both of which are incorporated herein by reference.

Amplified line signals SIG1' and SIG2' from the signal amplifiers 305 are then processed by processor 307 which performs automatic gain control amplification and black level calibration. Processed line signals SIG1" and SIG2" from processor 307 go to the color matrix 309. The color matrix 309 combines the line signals in various proportions according to matrix equations and also performs gamma correction so as to derive the output color signals, such as green (G'), red (R'), blue (B'), or the luminance signal (Y'). The "prime" indicates the signal has undergone gamma correction. The red (R') and blue (B') output color signals may be obtained as a function of the difference between two line signals. The luminance signal (Y') is formed from a linear matrix function by which the other signals are combined in various proportions. As described previously, some of these functions require the use of the delay line for the signal processing. The processor 311, which performs the luminance signal process, takes the signal Y' from the color matrix 309 and outputs the signal YH along with a feedback signal which goes to the AEC detector 317. The YH signal is the luminance signal with high frequency components.

The color signals G', R', and B' go from the color matrix 309 to the processor 313, which performs the chromaticity signal process, where they are processed so as to produce the signals –(R–Y) and –(B–Y), from which the chroma signal is formed. The chroma signal is formed by quadrature modulating the two color difference signals, (R–Y) and (B–Y), on a color subcarrier. In alternate systems, I (in phase) and Q (quadrature) color difference signals are sometimes used rather than (R–Y) and (B–Y), although the latter are what are most often used in consumer cameras. The phase and amplitude of the chroma signal indicate hue and saturation.

The NTSC encoder 315 receives control timing signals SYNC and BLANK from a video timing generator 319, and also receives control signals FSC, HUE, and SATURATION. The YH signal from the luminance signal process 311, and the color difference signals –(R–Y) and –(B–Y) from the chromaticity signal process 313, go to the NTSC encoder 315 where they are processed to produce the output signals CVBS (composite video with blank and sync) and the Y+C combined signal. The baseband luminance signal (Y) correlates to the brightness of the image, and the quadrature-modulated chrominance signal (C) correlates to the color of the image.

The processor 311, which performs the luminance signal process, outputs a feedback signal to the AEC detector 317, which outputs a control signal to the controller 321 which performs the AEC & AGC control. As is known in the art, AEC refers to automatic exposure control. The video timing generator 319 outputs timing signals SAMPLE and PRECHARGE which go to the sample and precharge areas of the array row controller 151, respectively, for purposes of controlling the scanning of the image sensor array 101. The array row controller 151 also includes a row driver section. The video timing generator 319 also outputs a timing signal to the controller 321 which performs the AEC & AGC control. The controller 321 outputs control signals to the sample timing counter 323 and to the precharge timing counter 325. The sample timing counter 323 and the precharge timing counter 325 are connected to the sample and precharge areas of the array row controller 151, respectively. The image sensor array 101 is controlled by the array row controller 151, the row calibration cells 153, and the column calibration cells 155.

As noted above, it is desirable that the sensor reading structure 201 be able to read two line signals from two separate rows in such a way that the needed portions of data from both rows is available to be processed at the appropriate time. Prior art devices have used digital or CCD delay lines for this purpose. As described previously, one of the problems with the digital delay line is the high power usage required for the analog to digital conversion. One of the problems with the CCD delay line is that it is necessarily external to the MOS imaging sensor, which can add to the number of chips and the complexity of the implementation. Thus, there is a need for a structure that can be easily fabricated on the same chip as the MOS sensor array and that can make available the needed signals from two separate rows of pixels during a specified processing interval.

Figure 3:
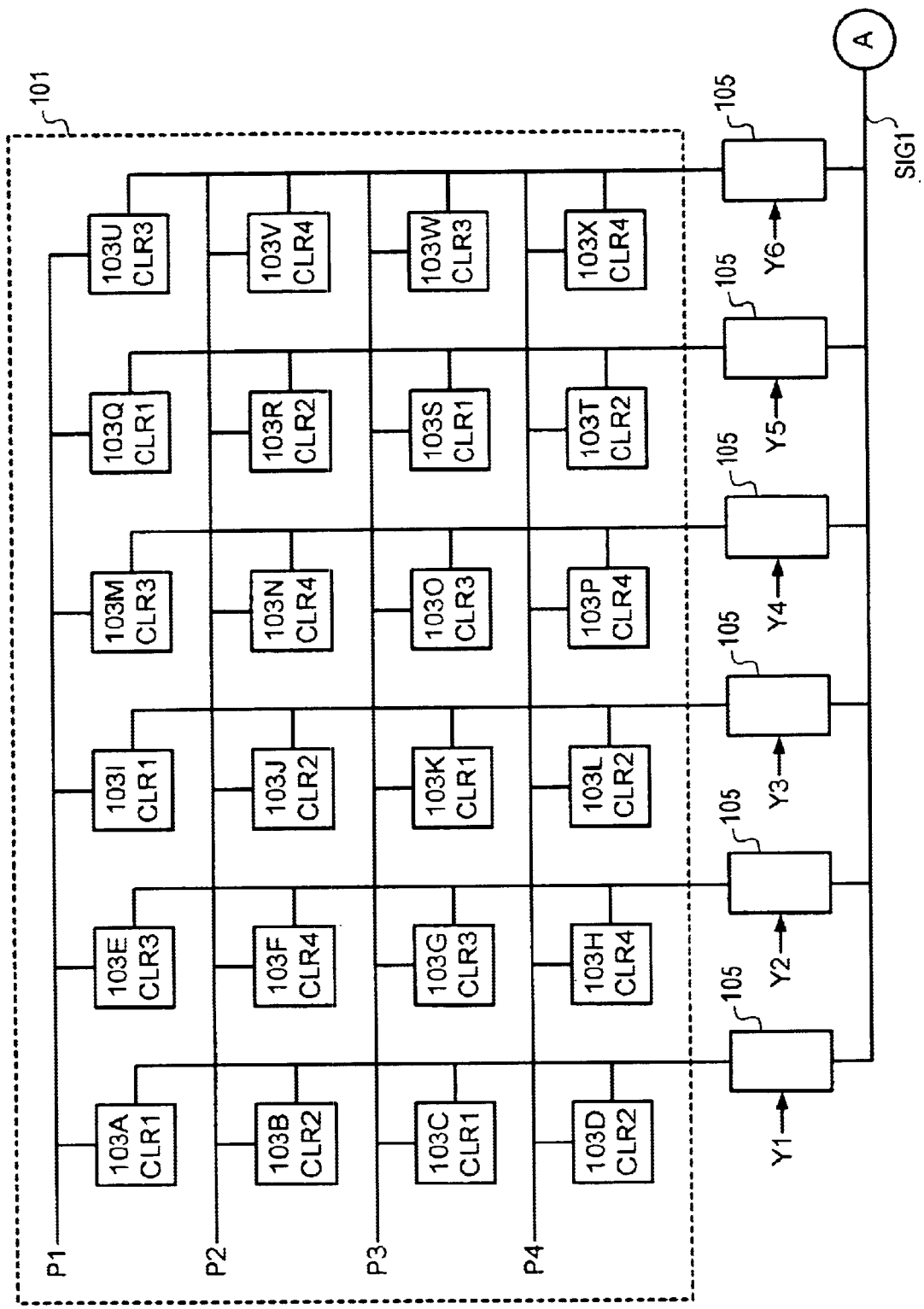
FIG. 3 is a schematic diagram of a six-column, four-row pixel array.

Turning now to FIG. 3, a pixel sensor array 101 that is read by the reading structure of the present invention is shown. The pixel sensor array 101 includes six columns of four rows of pixels 103. As shown, each pixel in each block of four pixels in FIG. 3 is designated as having one of four colors, CLR1, CLR2, CLR3, or CLR4. In one embodiment the colors CLR1 and CLR4 would be the same (green).

In the embodiment illustrated in FIG. 3, the first column of pixels has pixels 103A to 103D, the second column has pixels 103E to 103H, and so on until the sixth column, which has pixels 103U to 103X. Each row of pixels is controlled by a pixel control signal P1, P2, P3, or P4. All of the pixels in the first row, including pixels 103A, 103E, 103I, 103M, 103Q, and 103U, are controlled by pixel control signal P1. The pixels in the second, third, and fourth rows are similarly controlled by pixel control signals P2, P3, and P4, respectively.

Six column amplifiers 105, one for each column of pixels in FIG. 3 are shown. Each column amplifier is controlled a column select signal Y1 to Y6. Thus, the first column amplifier is controlled by column select signal Y1, the second column amplifier 105 is controlled by column select signal Y2, and so on until the sixth column amplifier which is controlled by the column select signal Y6. The outputs of all six column amplifiers are coupled together at a signal line SIG1. Signal line SIG1 continues to a point "A", that will be further illustrated with respect to FIG. 4.

Figure 4:
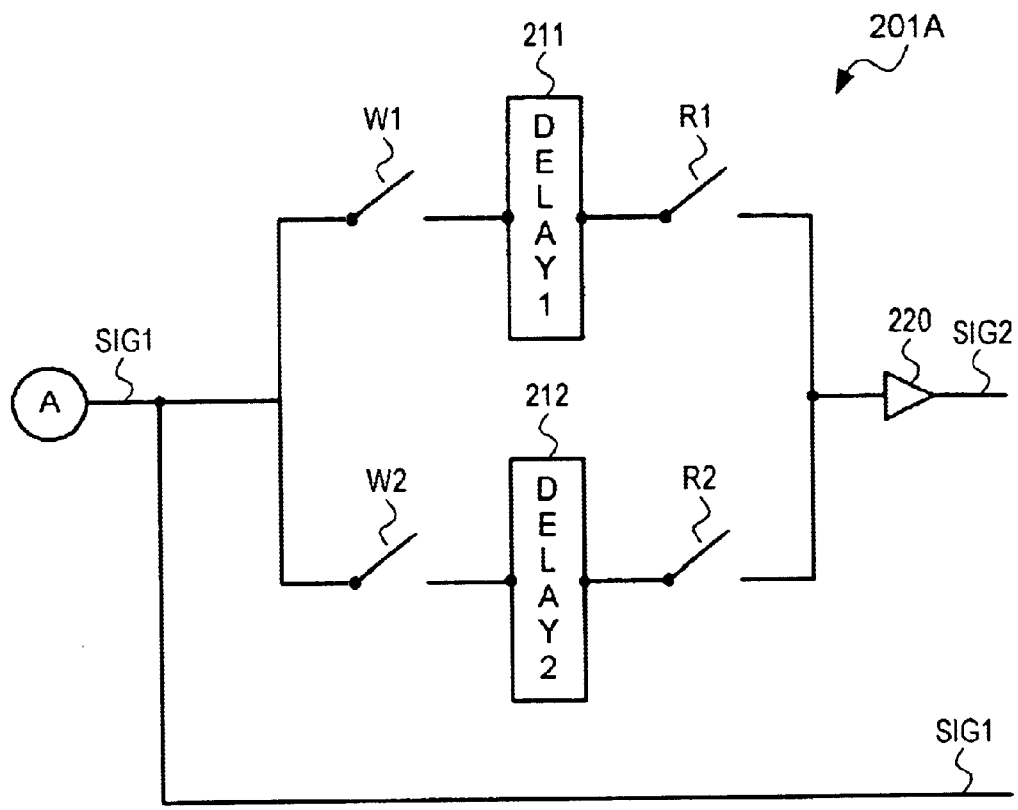
FIG. 4 is a block diagram of a sensor reading structure utilizing two analog delay lines formed in accordance with the present invention.

FIG. 4 illustrates a reading structure 201A formed in accordance with the present invention. As shown, reading structure 201A includes two delay lines 211 and 212 formed in accordance with the present invention. This structure illustrates the method by which the present invention may read two line signals from two rows of pixels simultaneously and thus provide the needed portions of data from the two rows during the specified processing interval.

As illustrated in FIG. 4, from point "A" signal line SIG1 is coupled to write switches W1 and W2. Write switch W1 couples signal line SIG1 to an input of delay line 211. The output of delay line 211 is coupled by a read switch R1 to an input of a buffer 220.

Signal line SIG1 is also coupled by a write switch W2 to an input of delay line 212. The output of delay line 212 is coupled by a read switch R2 to the input of buffer 220. The output of buffer 220 is coupled to a signal line SIG2. The two output signals from the reading structure 201A are therefore signal lines SIG1 and SIG2.

As will be described in more detail below, the purpose of the reading structure 201A of FIG. 4 is to provide a delayed output of a row of pixel signals, so that the signals from the row of pixels that is currently being read out can be processed simultaneously with the pixels from the previous row. Thus, signal line SIG1 carries signals from the current row of pixels, whereas signal line SIG2 carries delayed signals from the previous row of pixels. The two delay lines 211 and 212 are used so that one delay line may be storing the pixel signals from the current row, while the other delay line is reading out the stored pixel signals from the previous row. The overall operation of the reading structure 201 A of FIG. 4 will be described in more detail below with respect to the timing diagrams of FIG. 9.

Figure 5:
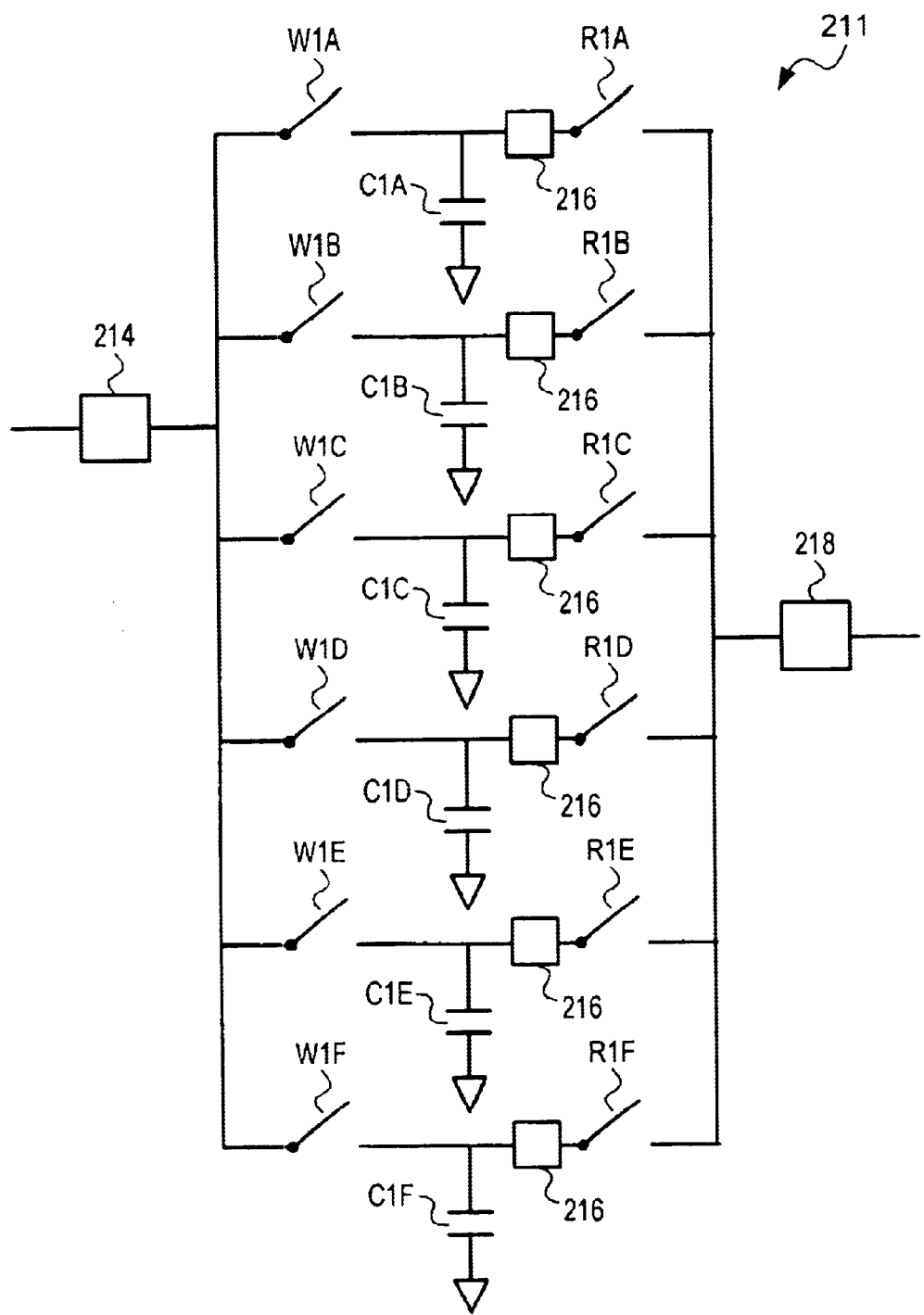
FIG. 5 is a block diagram of an analog delay line formed in accordance with the present invention.

FIG. 5 shows a schematic implementation of the delay line 211 of FIG. 4. Delay line 212 is similar to delay line 211, with the exception that the switches and capacitors of delay line 212 are given different designations, as will be described in more detail below. As illustrated in FIG. 5, the input to the delay line 211 is coupled by a component 214 to a series of six switches W1A to W1F. Each of the six switches W1A to W1F couples to one side of one of six capacitors C1A to C1F, respectively. The other sides of the capacitors C1A to C1F are coupled to ground. The six capacitors C1A to C1F are coupled through six components 216 to a series of six switches R1A to R1F, respectively. Each of the six switches R1A to R1F couples each of the six capacitors C1A to C1F, respectively, to a component 218. The output of component 218 is the output of the delay line 211.

Figure 6A:
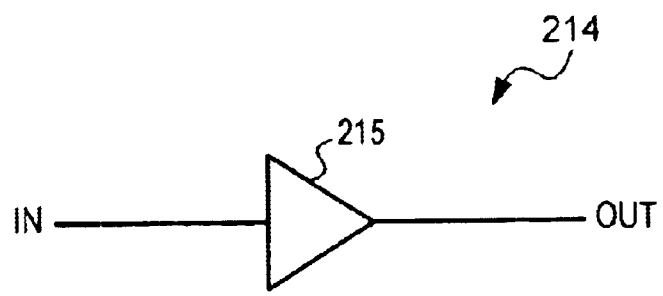
FIGS. 6–8 illustrate various embodiments of the buffer and amplifier components of FIG. 5.
Figure 6B:
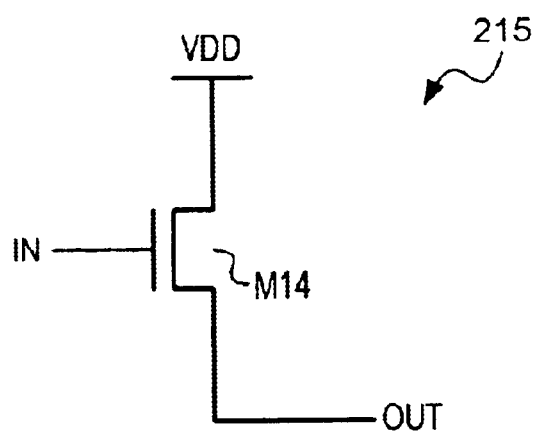

FIGS. 6A and 6B illustrate an embodiment of component 214 of FIG. 5. As illustrated in FIG. 6A, component 214 may include a buffer 215 with an input and an output. As illustrated in FIG. 6B, buffer 215 may comprise a MOS switch M14. As illustrated in FIG. 6B, the source of MOS switch M14 is coupled to the power supply VDD, while the gate is coupled to the input of the buffer 215, and the drain provides the output.

Figure 7A:
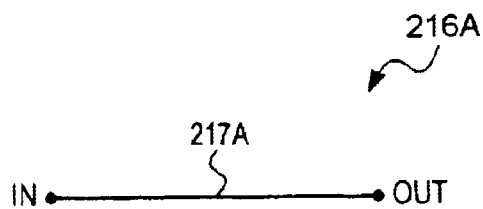
Figure 7B:
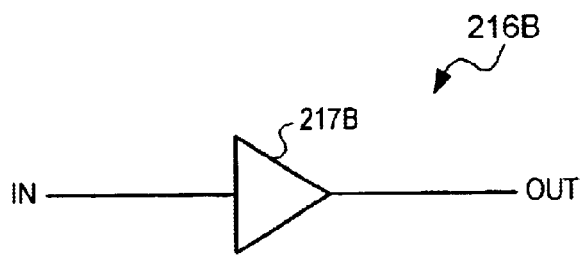
Figure 7C:
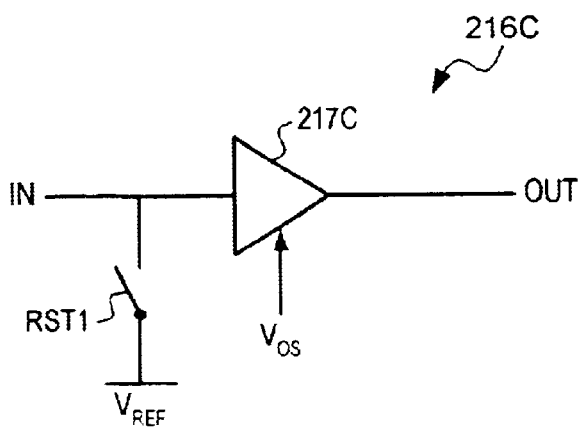

FIGS. 7A to 7C illustrate various embodiments of component 216. As illustrated in FIG. 7A, in one embodiment, the component 216a comprises a simple conductor wire 217a. In the embodiment of FIG. 7A, the component 216 is merely a continuation of the conductor that couples the capacitors C1 to the switches R1. As illustrated in FIG. 7B, in another embodiment, the component 216b includes a buffer 217b. Buffer 217b may be similar to the buffer 215 described previously with respect to FIGS. 6A and 6B. FIG. 7C illustrates another embodiment of the component 216. As illustrated in FIG. 7C, the component 216c includes a buffer 217c in which the offset may be adjusted by a control signal $V_{os}$. The input of the buffer 217c is coupled to a reference voltage $V_{ref}$ by a reset switch RST1.

Figure 8A:
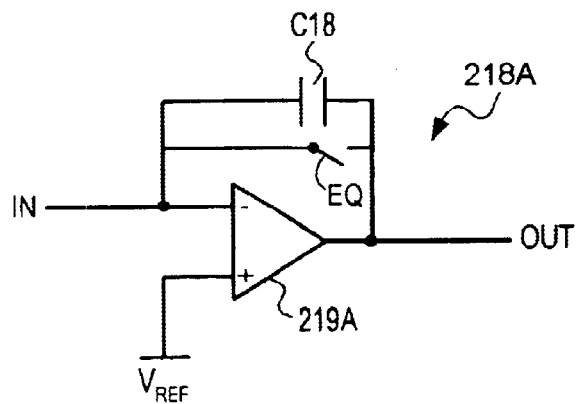
Figure 8B:
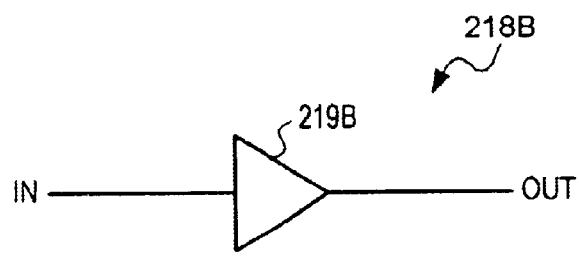
Figure 8C:
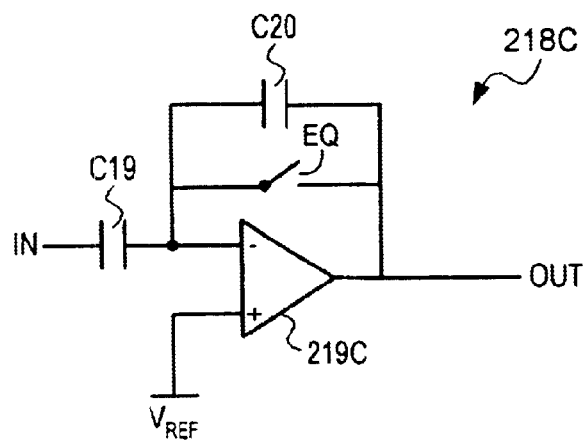

FIGS. 8A to 8C illustrate various embodiments of component 218 of FIG. 5. As illustrated in FIG. 8A, in one embodiment, a component 218a includes an operational amplifier 219a. Operational amplifier 219a has its inverting input coupled by a feedback capacitor C18 to its output. An eqalizing switch EQ also couples the noninverting input of operational amplifier 219a to its output. The noninverting input of operational amplifier 219a is coupled to a reference voltage $V_{ref}$. As illustrated in FIG. 8B, in another embodiment, a component 218b includes a buffer 219b. As illustrated in FIG. 8C, in another embodiment, a component 218c includes an operational amplifier 219c. The input of the component 218c is coupled by a capacitor C19 to the inverting input of the operational amplifier 219c. The non-inverting input of the operational amplifier 219c is coupled to a reference voltage $V_{ref}$. The inverting input of the operational amplifier 219c is coupled by a capacitor C20 to the output of the operational amplifier 219c. An equalizing switch EQ is also coupled between the inverting input of the operational amplifier 219c and the output.

Depending on the types of pixels used and the desired pixel signal processing, the various embodiments for the components 216 and 218 illustrated in FIGS. 7 and 8 may be used. In one implementation, the embodiments of FIGS. 7A and 8A are used together, while in another implementation the embodiments of FIGS. 7B and 8B are used together, and while in still another implementation, the embodiments of FIGS. 7C and 8C are used together. In general, when the pixels 103 are passive pixels, the components are more likely to be directed toward charge amplifiers, whereas if the pixels 103 are active pixels, the components are more likely to be voltage buffers or voltage amplifiers, or to be simple conductors as illustrated in the embodiment of FIG. 7A.

With regard to the various embodiments illustrated in FIGS. 7 and 8, there are certain advantages to each configuration. For example, in the embodiments illustrated by FIGS. 7B and 8B, there is shown to be an amplifier for each storage cell capacitor of the delay line 211. This configuration effectively addresses the relatively large parasitic capacitance that exists in the delay line 211 at the component 218. In other words, because all of the switches of the delay line 211 are coupled to the same points, relatively large parasitic capacitances exist. This relatively large parasitic capacitance can cause the system to operate more slowly. By including amplifiers for each storage cell capacitor, the amplifiers are able to drive the voltages over the parasitic capacitances very quickly. Thus, the overall speed of the system can be increased.

With regard to the embodiments of FIGS. 7A and 8A, one of the advantages of this configuration is the relatively simple layout that requires fewer components and connections. Thus, a smaller, less expensive circuit results. In addition, there are no concerns with regard to the mismatches that can occur when multiple amplifiers are used for each capacitor.

The embodiments of FIGS. 7C and 8C help address the concern of mismatches between multiple amplifiers. For example, if there are 640 pixels in a row, 640 amplifiers and components would be required, which could have as much as 10s of millivolts of mismatches between them. The implementation of the embodiments of FIGS. 7C and 8C can provide for correlated double sampling, and a reference voltage for the double sampling and subtraction for noise canceling, that allows the voltage mismatch between the columns to be reduced.

Figure 9:
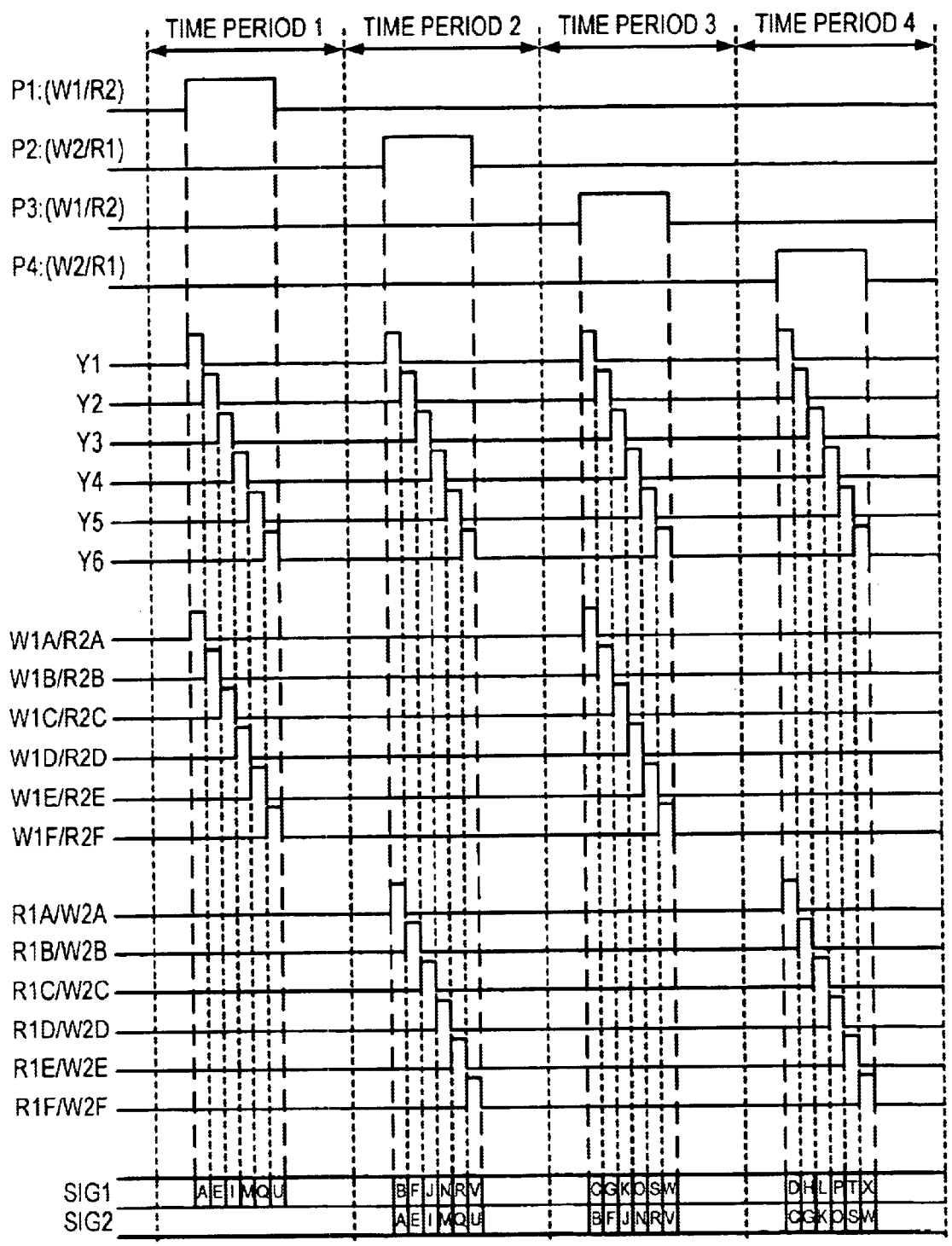
FIG. 9 is a timing diagram illustrating the operation of the reading structure of FIG. 4.

The operation of the reading structure 201A shown in FIGS. 4 and 5 is illustrated by the timing diagrams shown in FIG. 9. In general, while the timing diagrams of FIG. 9 show pixel signals as being transferred relatively instantaneously, it is understood that the actual transfer of such signals involves transient periods, due to the charging of the capacitors and similar phenomena, which are not shown in the diagrams. In addition, while the signals are shown for a certain time period in the diagrams, it is understood that the named signals do not necessarily remain on the line signals for the full time period shown, and they are shown there only for purposes of illustration as if the charge for each of the capacitors have been transferred to the signal line SIG2. It is also understood that in an actual implementation there may be spacing between the signals such that intermediary processes can occur, such as resetting the signal levels on the capacitors or of the amplifiers or buffers to a desired reset value.

As shown in FIG. 9, at the beginning of a time period 1, the pixel control signal P1 goes high at the same time as the column select switch Y1 of FIG. 3, the write switch W1 of FIG. 4, and the write switch W1A of FIG. 5. Thus, the pixel signal from pixel 103a appears on signal line SIG1 and is also stored on capacitor C1A. Similarly, in the next time increment during time period 1, the column select signal Y2 goes high at the same time as write switch W1B, thus reading out the signal from pixel 103e on signal line SIG1 at the same time that the signal is stored on capacitor C1B. This process continues for reading out the signals from pixels 103*i*, 103*m*, 103*q*, and 103*u*, which are stored on capacitors C1C, C1D, C1E, C1F, respectively. Once all of the pixels of the first row have been read out, the control signal P1 and the write switch W1 at transition low, thus indicating the end of write operation from the first row of pixels.

As was described previously with respect to FIG. 4, delay line 212 is similar to delay line 211, except with different switch and capacitor designations. More specifically, while the write switches of delay line 211 are designated as switches W1A to W1F, the write switches of delay line 212 are designated as switches W2A to W2F. Similarly, the capacitors of delay line 212 are designated as capacitors C2A to C2F, and the read switches are designated as switches R2A to R2F. These designations are used in the timing diagrams of FIG. 9, as described below.

During time period 2, the control signal P2 for the second row of pixels, the control signal for write switch W2, and the control signal for read switch R1 all go high at the same time. The control signal P2 and the control signal for write switch W2 going high indicates that the second row of pixels will be written into the delay line 212 of FIG. 4. The control signal for read switch R1 going high indicates that the pixel signals from the first row of pixels that were stored in delay line 211 during time period 1, will now be read out on signal line SIG2. As illustrated in FIG. 9, column select signal Y1 goes high at the same time as the control signals for read switch R1A and write switch W2A. Thus, during this first increment of time period 2, the signal from the first pixel 103*b* of the second row is read out onto signal line SIG1, and is also stored in capacitor C2A of delay line 212. At the same time, the control signal for the read switch R1A causes the pixel signal from pixel 103*a* that it had previously been stored on capacitor C1A to be read out on signal line SIG2. In this manner, the signals from pixel 103*a* of the first row and pixel 103*b* of the second row are read out simultaneously on signal lines SIG2 and SIG1, respectively, as is the goal of the system.

Similarly, in the next increment during time period 2, the column select signal Y2 goes high the same time as the control signals for the read switch R1B and the write switch W2B. The control signal for the write switch W2B going high causes the signal from the second pixel 103*f* of the second row to be written into capacitor C2B of delay line 212. At the same time, the control signal for the read switch R1B causes the signal from the second pixel 103*e* of the first row that was previously stored on capacitor C1B to be read out onto the signal line SIG2. Thus, signals from the pixels 103*e* and 103*f* from the first and second rows, respectively, are placed on the signal lines SIG1 and SIG2 at the same time, as is the goal of the system.

This process continues during time period 2 thus storing signals from the remaining pixels of the second row, including pixels 103*j*, 103*n*, 103*r*, and 103*v*, on capacitors C2C, C2D, C2E, and C2F, respectively. These signals are also placed on the signal line SIG1 at the same time that the signals from the corresponding adjacent pixels of the first row, including pixels 103*i*, 103*m*, 103*q*, and 103*u*, are read out from the capacitors C1C, C1D, C1E, and C1F onto signal line SIG2. Thus, the signal from pixel 103*i* is read out at the same time as the signal from pixel 103*j*, followed by the reading out of the signals from pixels 103*m* and 103*n*, the signals from pixels 103*q* and 103*r*, and finally the signals from pixels 103*u* and 103*v*. After all of the signals from the second row of pixels have been read out, the control signal P2 for the second row goes low, thus indicating the end of the pixel reading process during time period 2. The control signals for the write switch W2 and the read switch R1 also go low at this time.

In time period 3, the process continues with the reading out of the pixel signals from the third row of pixels 103*c*, 103*g*, 103*k*, 103*o*, 103*s*, and 103*w*. As the signals are read out, the signals from the corresponding adjacent pixels in the second row are read out from the capacitors C2A to C2F, of which they were previously stored during time period 2. In this manner, the signal lines SIG1 and SIG2 are shown to simultaneously contain the signals from adjacent pixels in the third and second rows, respectively, as is the goal of the system. At the end of the pixel reading process in time period 3, the control signal P3 goes low at the same time as the control signals for the write switch W1 and the read switch R2. As indicated to the left of the timing diagram for the control signal P3 in FIG. 9, the symbols for the control signals for write switch W1 and read switch R2 are shown in parentheses, as these signals follow the transitions of the signal P3 only during time period 3. The signals W1 and R2 transition independently of the control signal P3 at other times (e.g., during time period 1 when the control signals for write switch W1 and read switch R2 transition with the transitions in control signal P1).

During time period 4, the process continues with the storing of signals from the fourth row of pixels in the second delay line 212, while the signals from the third row of pixels that were previously stored in the first delay line 211 are read out on the signal line SIG2. In this manner, the signals from the fourth and third rows of pixels are read out simultaneously on the signal lines SIG1 and SIG2, respectively, as is the goal of the system.

Figure 10:
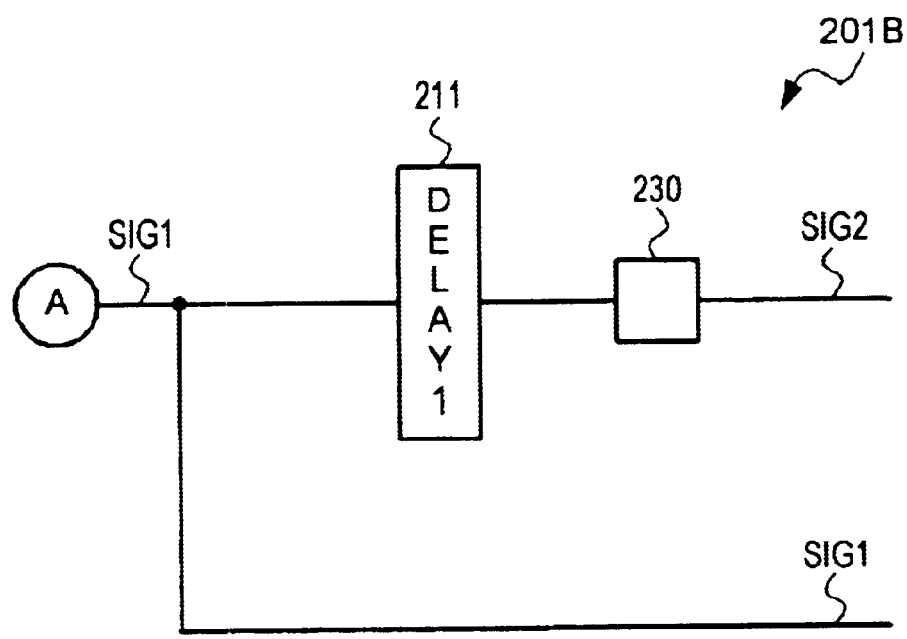
FIG. 10 is a reading structure utilizing a single delay line and single pixel delay circuit formed in accordance with the present invention.

FIG. 10 illustrates another embodiment of the reading structure 201 of FIG. 2. As illustrated in FIG. 10, reading structure 201B includes a delay line 211 and a single pixel delay circuit 230. From a point "A", signal line SIG1 is coupled to the input of delay line 211. The output of delay line 211 is coupled to the input of single pixel delay circuit 230, and the output of the single pixel delay circuit 230 is coupled to signal line SIG2. The outputs from the reading structure 201B are therefore the signal lines SIG1 and SIG2.

Figure 11:
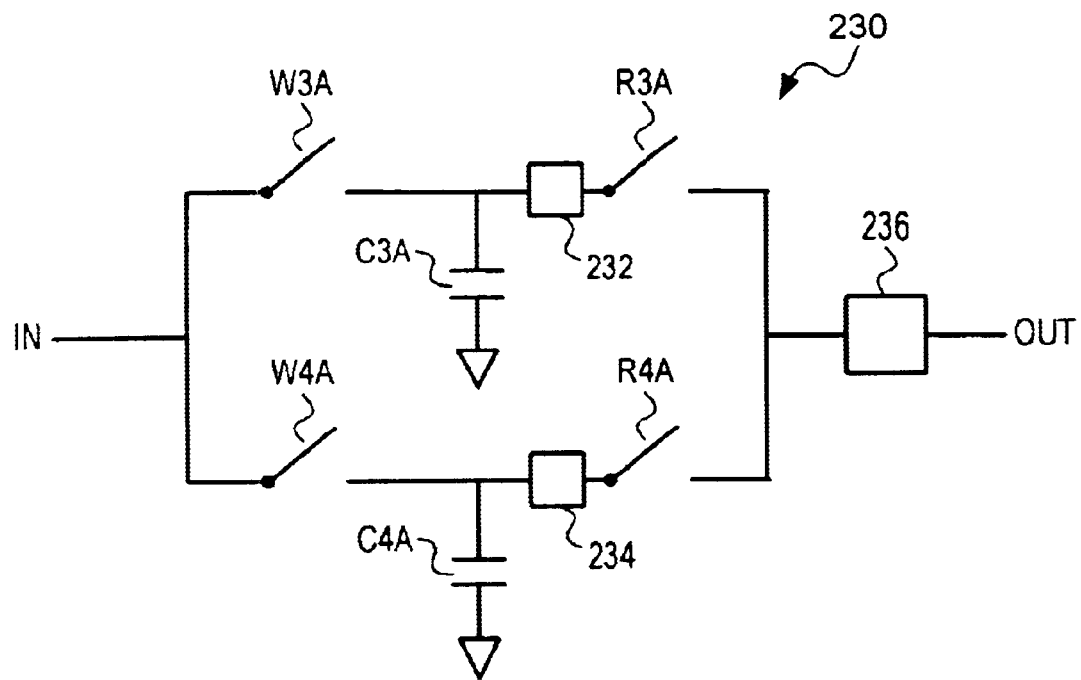
FIG. 11 is a schematic diagram of a single pixel delay circuit of FIG. 10.

FIG. 11 shows a schematic diagram of the single pixel delay circuit 230. As illustrated in FIG. 11, the input of the single pixel delay circuit 230 is coupled to a write switch W3A. The write switch W3A couples the input to one side of a capacitor C3A and to an input of a component 232. The other side of capacitor C3A is coupled to ground. The output of component 232 is coupled to a read switch R3A. Read switch R3A couples component 232 to the input of a component 236. The output of component 236 is the output of the single pixel delay circuit 230.

Also coupled to the input of the single pixel delay circuit 230 is a write switch W4A. Write switch W4A couples the input to one side of a capacitor C4A and also to the input of a component 234. The other side of capacitor C4A is coupled to ground. The output of component 234 is coupled to a read switch R4A. Read switch R4A couples the component 234 to the input of the component 236.

Figure 12:
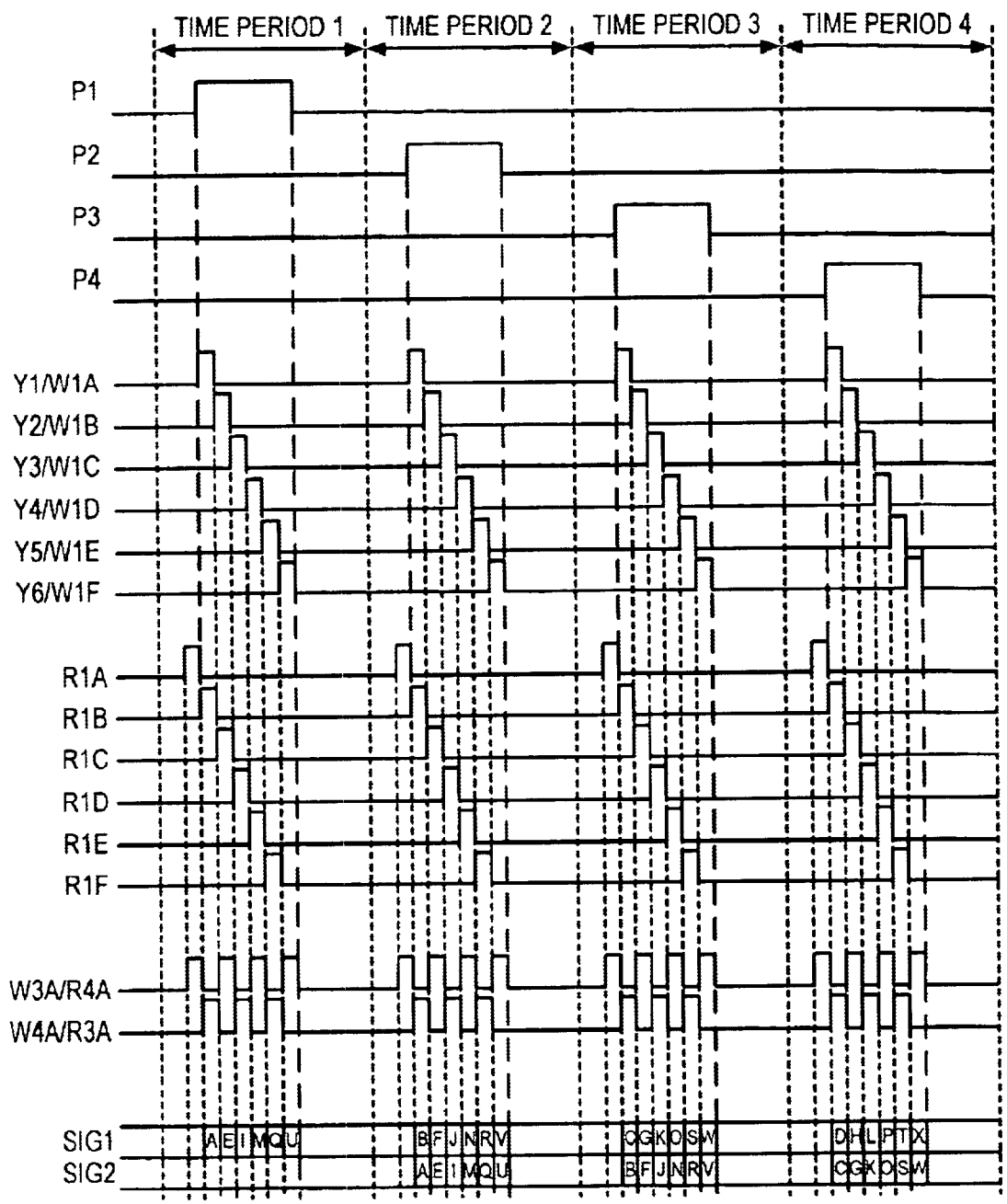
FIG. 12 is a timing diagram illustrating the operation of the reading structure of FIG. 10.

The operation of the reading structure 201B of FIG. 10 and the single pixel delay circuit of FIG. 11 is illustrated in the timing diagrams of FIG. 12. The timing diagrams for FIG. 12 have some similar components to those of FIG. 9. As illustrated in FIG. 12, during time period 1, the control signal P1 for selecting the first row of pixels 103*a* to 103*u* goes high. At the same time, the column select signal Y1 and the control signal for the write switch W1A of FIG. 5 go high. Thus, the signal from the first pixel 103a of the first row is read out onto signal line SIG1, and is also stored in capacitor C1A of delay line 211. In the next time increment during period 1, column select signal Y2 and the control signal for write switch W1B of FIG. 5 go high. This causes the signal from the second pixel 103e of the first row to be read out onto signal line SIG1, and also be stored on capacitor C1B of FIG. 5. This process continues for the remaining pixels of the first row, such that the signals from pixels 103i, 103m, 103q, and 103u are read out onto signal line SIG1 and are also stored in the capacitors C1C, C1D, C1E, and C1F of the delay line 211. While the switches R1A to R1F, and W3A, W4A, R3A, and R4A are also shown as transitioning during time period 1, they do not contribute to the pixel signals shown on the signal lines SIG1 and SIG2 until time period 2.

During time period 2, in the first time increment the control signals for read switch R1A, write switch W3A, and read switch R4A transition high. This causes the pixel signal from the first pixel 103a of the first row that was previously stored in capacitor C1A of delay line 211 to be transferred and stored in capacitor C3A of single pixel delay circuit 230. During the next time increment, the column select signal Y1 and the control signal for the write switch W1A transition high. This causes the signal from the first pixel 103b of the second row to be read out on signal line SIG1, and also to be stored in the capacitor C1A of the delay line 211. It should be noted, that the storing of the signal from the first pixel 103b from the second row during this time increment is what necessitated the removal of the signal from the first pixel 103a of the first row from the capacitor C1A in the previous increment during time period 2. In other words, the signal from the pixel of the first row pixel 103a needed to be cleared out before the signal from the pixel 103b of the second row could be stored in the capacitor C1A.

Similarly, during this same increment, the second pixel 103e from the first row needs to be cleared out from the capacitor C1B so that the signal from the second pixel 103f of the second row could be stored in the capacitor C1B in the following increment. This is accomplished by the control signal for the read switch R1B going high at the same time as the write switch W4A, so that the pixel signal from the second pixel 103e of the first row is transferred from the capacitor C1B to the capacitor C4A. At the same time, the control signal for the read switch R3A transitions high, thus reading out the pixel signal from the first pixel 103a of the first row that was previously stored on the capacitor C3A onto the signal line SIG2. In this manner, the signal from the first pixel 103a of the first row is read out on the signal line SIG2 at the same time that the signal from the first pixel 103b of the second row is read out onto the signal line SIG1. In this manner, the signals of pixels in adjacent rows are read out simultaneously, as is the goal of the system.

This process continues during time period 2, during which the signals from the remaining pixels 103e, 103i, 103m, 103q, and 103u of the first row are transferred from their previously stored locations on capacitors C1B, C1C, C1D, C1E, and C1F of delay line 211, to either capacitors C4A or C3A of single pixel delay circuit 230. Then, each signal is transferred out of single pixel delay circuit 230 onto signal line SIG2. As described above, the signals must be transferred off the capacitor C1B, C1C, C1D, C1E, and C1F before the signals from the remaining pixels 103f, 103j, 103n, 103r, and 103v of the second row are stored thereon.

Thus, the single pixel delay circuit 230 serves as a temporary storage for the pixel signals, to hold them for a single time increment between which the pixel signals from the first row are removed from the delay line 211, following which they are read out onto the signal line SIG2 at the same time that the signals from the pixels of the second row are both being stored on the capacitors of the delay line 211 and being read out on the signal line SIG1. In this manner, the signals from the pixels 103b, 103f, 103j, 103n, 103r, 103v are read out on signal line SIG1 at the same time as the corresponding adjacent pixels 103a, 103e, 103i, 103m, 103q, and 103u of the first row are read out on signal line SIG2. In this manner, the signals from the pixels of the first row are read out simultaneously with adjacent pixels of the second row, as is the goal of the system. A similar process occurs during time periods 3 and 4, with a simultaneous reading out of adjacent pixels in rows 2 and 3, and then rows 3 and 4, respectively.

While the preferred embodiment of the invention has been illustrated and described, it will be appreciated that various changes can be made therein without departing from the spirit and scope of the invention. For example, while the invention has been described as it would operate for simultaneously reading out pixel signals from pixels in adjacent rows, the invention could similarly operate for simultaneously reading out pixel signals from pixels in every other row. Such an operation could occur for even field and odd field type reading operations, as described in co-pending application Ser. No. 09/110,879, entitled "Single-Chip Color CMOS Image Sensor With Two or More Line Reading Structure and High-Sensitivity Interlaced Color Structure", filed Jul. 7, 1998, which is hereby incorporated by reference. Similarly, the pixel signals from every other pixel in a given row could be coupled to a common signal line, rather than having every pixel in a given row being coupled to a common signal line. Thus, the invention should not be limited to the preferred embodiment described herein, but should be limited only by the claims below.

The embodiments of the invention in which an exclusive property or privilege is claimed are defined as follows:

1. A reading structure including an analog delay line for a MOS image sensor having a pixel array formed from a plurality of individual pixels organized as rows and columns, the reading structure comprising:

a first common signal line coupled to a plurality of columns of the pixel array for receiving pixel signals from selected pixels in the columns;

a first delay line coupled to the first common signal line for receiving and storing the pixel signals; the first delay line comprising:

an input line coupled to the first common signal line;

an output line coupled to a second common signal line;

a first set of write switches coupled to the input line, the first set of write switches being coupled in parallel and having at least one switch for each of the columns coupled to said first common signal line;

a first set of storage capacitors, the first set of storage capacitors having at least one capacitor associated with each of said write switches, the write switches operating in sequence so as to write one of each of the pixel signals from a row of pixels in sequence into one each of said capacitors of said first set of storage capacitors; and a first set of read switches for selectively reading out the pixel signals from the first set of storage capacitors onto the output line; and a second delay line coupled to the first common signal line for receiving and storing the pixel signals;

first and second primary write switches for coupling the inputs of the first and second delay lines, respectively, to the first common signal line; and first and second primary read switches for coupling the outputs of the first and second delays lines, respectively, to the second common signal line.

2. The reading structure of claim 1, further comprising a pixel delay circuit coupled between the output of the first delay line and the second common signal line, the pixel delay circuit comprising:
   a second set of storage capacitors for alternatingly storing pixel signals that are output from the first delay line;
   a second set of write switches coupled to the output of the first delay line, the second set of write switches alternatingly operating to write pixel signals that are output from the first delay line onto each of the capacitors of the second set of storage capacitors; and
   a second set of read switches coupled to the second common signal line for alternatingly reading out the pixel signals from the second set of storage capacitors onto the second common signal line.

3. The reading structure of claim 1, wherein the first delay line further comprises a buffer coupled between the first common signal line and the input line.

4. The reading structure of claim 1, wherein the first delay line further comprises a first set of read buffers, each read buffer being coupled between one of the storage capacitors of the first set of storage capacitors and one of the read switches of the first set of read switches.

5. The reading structure of claim 1, wherein the first delay line further comprises a charge amplifier coupled between the output of the delay line and the second common signal line.

6. A method for simultaneously processing analog signals from two rows of a MOS image sensor having a pixel array of a plurality of individual pixels organized as a plurality of rows and columns, said method comprising the steps of:
   (a) reading out from the pixel array and transferring the analog pixel signal from each individual pixel of a plurality of selected pixels in a first row of the pixel array over a first common signal line to a reading structure having at least one individual memory cell for each of the selected pixels of the first row, the memory cells being external to the pixels, and further storing the analog pixel signals on the memory cells;
   (b) reading out from the pixel array and transferring the analog pixel signal from each individual pixel of a plurality of selected pixels in a second row of the pixel array over the first common signal line to the reading structure having at least one individual memory cell for each of the selected pixels of the second row, the memory cells being external to the pixels, and further storing the analog pixel signals on the memory cells; and
   (c) at the same time that the analog pixel signals from the plurality of selected pixels in the second row are being read out from the pixel array and stored on the memory cells, reading out from the reading structure the analog pixel signals from the selected pixels of the first row that were previously stored on the memory cells,
   wherein the memory cells that store the analog pixel signals from the selected pixels of the first row comprise a first set of memory cells, and the memory cells that store the analog pixel signals from the selected pixels of the second row comprise a second set of memory cells.

7. The method of claim 6, wherein the first and second rows of selected pixels are adjacent to one another, and the analog pixel signals from substantially adjacent pixels in the two rows are read out at the same time.

8. The method of claim 6, wherein the pixel array further comprises a third row of selected pixels, and wherein after the analog pixel signals from the first row of selected pixels have been read out from the first set of memory cells, the analog pixel signals from the third row of selected pixels are stored on the first set of memory cells.

9. The method of claim 6, wherein the memory cells on which the analog pixel signals from the first row are stored are the same memory cells on which the analog pixel signals from the second row are stored, and wherein after the pixel signals are read out from the memory cells, they are temporarily stored in a pixel delay circuit.

10. The method of claim 9, wherein the analog pixel signals from the second row of pixels are read out from the pixel array at the same time that the analog pixel signals from the first row of pixels are read out from the pixel delay circuit.

11. The method of claim 10, wherein the first and second rows of pixels are adjacent to one another, and wherein the analog pixel signals from substantially adjacent pixels in the two rows are read out at the same time.

12. A reading structure for a MOS image sensor having a pixel array formed from a plurality of individual pixels organized as rows and columns, the reading structure comprising:
   (a) a first common signal line coupled to a plurality of columns of the pixel array for receiving pixel signals from pixels in the columns of the pixel array;
   (b) a first set of storage capacitors having at least one capacitor for each of the plurality of columns;
   (c) a first set of switches coupled to the first common signal line for selectively placing signals from a plurality of pixels in a first row of the pixel array on the first set of storage capacitors, each switch operating in sequence to couple the first common signal line to each of the storage capacitors in sequence so as to place a signal from each selected pixel of the row on one of each of the storage capacitors, such that at the end of the sequence, the signal from each of the pixels in the row is stored on at least one of the capacitors in the set of storage capacitors;
   (d) a second common signal line for receiving pixel signals from the storage capacitors; and
   (e) a second set of switches for selectively reading out the signals from the storage capacitors onto the second common signal line;
   (f) a second set of storage capacitors having at least one capacitor for each of the plurality of columns;
   (g) a third set of switches coupled to the common signal line for selectively placing signals from a plurality of pixels in a second row of the pixel array on the second set of said storage capacitors, each switch operating in sequence to couple the first common signal line to each of the storage capacitors in the second set of storage capacitors in sequence so as to place a signal from each selected pixel of the second row on one of each of the storage capacitors, such that at the end of the sequence, the signal from each of the pixels in the second row is stored on at least one of the capacitors in the second set of storage capacitors; and
   (h) a fourth set of switches for selectively reading out the signals from the second set of storage capacitors onto the second common signal line.

13. The reading structure of claim 12, wherein the second set of switches are operated in sequence at the same time that the third set of switches are operated in sequence, such that the pixel signals from the first row of pixels is read out from the first set of storage capacitors on the second common signal line at the same time that the pixel signals from the second row of pixels are being placed on the second set of storage capacitors.

14. The reading structure of claim 12, wherein the pixel array includes a third row having a pixel in each column that is coupled to the first common signal line, the analog pixel signals from said third row being selectively placed in sequence by the first set of switches on the first set of storage capacitors.

15. The reading structure of claim 12, further comprising a pixel delay circuit coupled to the second common signal line, the pixel delay circuit comprising:

- a second set of storage capacitors for temporarily storing pixel signals that are read out from the first set of storage capacitors;
- a third set of switches for selectively coupling the second common signal line to the second set of storage capacitors;
- a third common signal line; and
- a fourth set of switches for selectively coupling the second set of storage capacitors to the third common signal line.

16. A reading structure for a MOS image sensor having a pixel array formed from a plurality of individual pixels organized as rows and columns, the reading structure comprising:

(a) a first common signal line coupled to a plurality of columns of the pixel array for carrying signals from the pixels;

(b) a first set of storage capacitors having at least one capacitor associated with each column of the pixel array;

(c) a first set of switches for selectively coupling the columns to the first common signal line in sequence for selectively placing analog signals from a first row of the pixels on the first set of storage capacitors in sequence during an initial time period, the first set of switches also selectively coupling the columns to the first common signal line in sequence during a later time period for selectively placing analog signals from a second row of the pixel array on the first set of storage capacitors during the later time period;

(d) a second set of storage capacitors, the second set of storage capacitors having at least one capacitor associated with each column of the pixel array, the first set of switches selectively coupling the columns to the first common signal line in sequence for selectively placing analog signals from a third row of the pixels on the second set of storage capacitors in sequence, the analog signal from each individual pixel of the third row being stored in sequence on at least one storage capacitor from the second set of storage capacitors.

17. The reading structure of claim 16, further comprising:

- a second set of switches coupled in parallel for selectively coupling the first common signal line to the first set of storage capacitors;
- a third set of switches coupled in parallel for selectively coupling the first common signal line to the second set of storage capacitors;
- a second common signal line;
- a fourth set of switches coupled in parallel for selectively coupling the first set of storage capacitors to the second common signal line; and
- a fifth set of switches coupled in parallel for selectively coupling the second set of storage capacitors to the second common signal line.

18. The reading structure of claim 16, further comprising a pixel delay circuit coupled to the first set of storage capacitors for reading out the pixel signals from the first set of storage capacitors, the pixel delay circuit outputting the analog pixel signals from the first row of pixels at the same time that the analog pixel signals from the second row of pixels are being placed on the first set of storage capacitors.

\* \* \* \* \*

UNITED STATES PATENT AND TRADEMARK OFFICE
CERTIFICATE OF CORRECTION

PATENT NO. : 6,707,496 B1
DATED : March 16, 2004
INVENTOR(S) : Hongli Yang et al.

It is certified that error appears in the above-identified patent and that said Letters Patent is hereby corrected as shown below:

Column 1,
Line 57, delete hyphen between "these" and "publications";

Column 6,
Line 67, "201 A" should be -- 201A --.

Signed and Sealed this

Thirteenth Day of July, 2004

JON W. DUDAS
*Acting Director of the United States Patent and Trademark Office*